(12) United States Patent
Abrokwah et al.

(10) Patent No.: US 8,853,743 B2
(45) Date of Patent: Oct. 7, 2014

(54) PSEUDOMORPHIC HIGH ELECTRON MOBILITY TRANSISTOR COMPRISING DOPED LOW TEMPERATURE BUFFER LAYER

(71) Applicant: Avago Technologies General IP (Singapore) Pte. Ltd., Singapore (SG)

(72) Inventors: Jonathan Abrokwah, Fort Collins, CO (US); Nathan Perkins, Fort Collins, CO (US); John Stanback, Fort Collins, CO (US); Philbert Marsh, Fort Collins, CO (US); Hans G. Rohdin, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 19 days.

(21) Appl. No.: 13/679,257

(22) Filed: Nov. 16, 2012

(65) Prior Publication Data

US 2014/0138746 A1 May 22, 2014

(51) Int. Cl.
*H01L 29/66* (2006.01)
*H01L 21/20* (2006.01)
*H01L 29/778* (2006.01)

(52) U.S. Cl.
CPC .............. *H01L 29/778* (2013.01); *H01L 21/20* (2013.01)
USPC ........................................... 257/194

(58) Field of Classification Search
CPC ....................... H01L 29/66462; H01L 31/0735
USPC ................... 257/E21.403, E21.407, E21.615, 257/E23.169, E29.25, 194, 728, 257/E29.246–E29.253, 135–136, 242, 329, 257/E27.091, E29.095–E27.096, 257/E27.095–E27.096, E29.118, E29.274, 257/E29.313, E29.318, E29.262, E21.41, 257/E21.629, E21.643; 438/167, 172, 136, 438/137, 156, 173, 192, 206, 212
See application file for complete search history.

(56) References Cited

U.S. PATENT DOCUMENTS

| | | | |
|---|---|---|---|
| 6,087,207 | A | 7/2000 | Tong |
| 6,483,134 | B1 | 11/2002 | Weatherford et al. |
| 7,144,765 | B2 | 12/2006 | Anda et al. |
| 7,253,455 | B2 | 8/2007 | Green et al. |
| 7,541,232 | B2 * | 6/2009 | Robinson et al. ............ 438/172 |
| 7,842,972 | B2 | 11/2010 | Nichols et al. |
| 7,851,909 | B2 | 12/2010 | Mishra et al. |
| 7,898,047 | B2 | 3/2011 | Sheppard |
| 8,174,050 | B2 | 5/2012 | Boles et al. |
| 2003/0006426 | A1 | 1/2003 | Kudo |
| 2005/0104087 | A1 | 5/2005 | Lan et al. |
| 2006/0145190 | A1 | 7/2006 | Salzman et al. |
| 2006/0163594 | A1 | 7/2006 | Kuzmik |

(Continued)

OTHER PUBLICATIONS

Ken Sawada, "Elimination of Kink Phenomena and Drain Current Hysteresis in InP-Based HEMTs With a Direct Ohmic Structure," IEEE Transactions on Electron Devices, vol. 50, No. 2, Feb. 2003, pp. 310-314.

(Continued)

*Primary Examiner* — Dao H Nguyen
*Assistant Examiner* — Tram H Nguyen

(57) ABSTRACT

A pseudomorphic high electron mobility transistor (PHEMT) comprises a substrate comprising a Group III-V semiconductor material, a buffer layer disposed over the substrate, wherein the buffer layer comprises microprecipitates of a Group V semiconductor element and is doped with an N-type dopant, and a channel layer disposed over the buffer layer.

20 Claims, 13 Drawing Sheets

(56) References Cited

U.S. PATENT DOCUMENTS

| | | | |
|---|---|---|---|
| 2008/0026545 A1 | 1/2008 | Cooke et al. | |
| 2008/0237605 A1* | 10/2008 | Murata et al. | 257/76 |
| 2008/0283870 A1* | 11/2008 | Sato | 257/194 |
| 2008/0308909 A1* | 12/2008 | Sakai et al. | 257/615 |
| 2009/0072252 A1* | 3/2009 | Son et al. | 257/94 |
| 2010/0200877 A1* | 8/2010 | Lee | 257/94 |
| 2013/0005118 A1* | 1/2013 | Jun et al. | 438/478 |

OTHER PUBLICATIONS

U.S. Appl. No. 13/459,864, filed Apr. 30, 2012.
Luysberg, et al., "Control of Stoichiometry Dependent Defects in Low Temperature GaAs", *IEEE Semiconducting and Semi-Insulating Materials Conference* 1996, 21-26.

* cited by examiner

PSEUDOMORPHIC HIGH ELECTRON MOBILITY TRANSISTOR COMPRISING DOPED LOW TEMPERATURE BUFFER LAYER

BACKGROUND

Pseudomorphic high electron mobility transistors (PHEMTs) are used extensively in wireless communication systems for switching, power and low noise amplifier applications. One reason for this extensive use is that PHEMTs are generally considered to have a suitable combination of noise, power, and high frequency performance for many applications.

A typical PHEMT comprises multiple epitaxial layers grown on gallium arsenide (GaAs) substrate. Such layers may include, in sequence, a GaAs buffer layer, a super-lattice buffer layer, an optional under channel pulse doped layer, a GaAs or aluminum gallium arsenide (AlGaAs) spacer, a channel layer comprising indium gallium arsenide (InGaAs), a top spacer layer of AlGaAs or GaAs containing an inserted n-type pulse or bulk doping layer, an undoped GaAs spacer layer, and a heavily-doped GaAs cap layer for ohmic contact formation. The PHEMT also comprises a source electrode and a drain electrode formed in ohmic contact and a Schottky metal gate electrode formed on the undoped layer over the channel layer.

During typical operation of a PHEMT, respective bias voltages are applied to the gate, source, and drain electrodes to conduct electrons through the channel layer between the source and drain electrodes. The bias conditions can affect the occupation of donor and acceptor traps in the buffer, the buffer/substrate interface, and the substrate. Ionized traps act as a backside gate and influence the carrier density in the channel and thus the drain current. After a bias change, trap occupation will slowly change to the new equilibrium value, causing hysteresis in drain current.

The slow change in trap occupation upon changing bias can lead to performance defects such as drain lag, gate lag, and kink. These defects tend to decrease the linearity and the efficiency of device performance, among other things. In addition, they can prevent the effective use of power management schemes such as envelope tracking, which might otherwise be used to improve efficiency and linearity in amplifier applications. Moreover, the severity of these performance defects may vary with temperature, which can further complicate their impact on overall device performance.

In view of these and other shortcomings of conventional PHEMTs, there is a general need for PHEMTs having improved linearity, efficiency, and temperature sensitivity.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
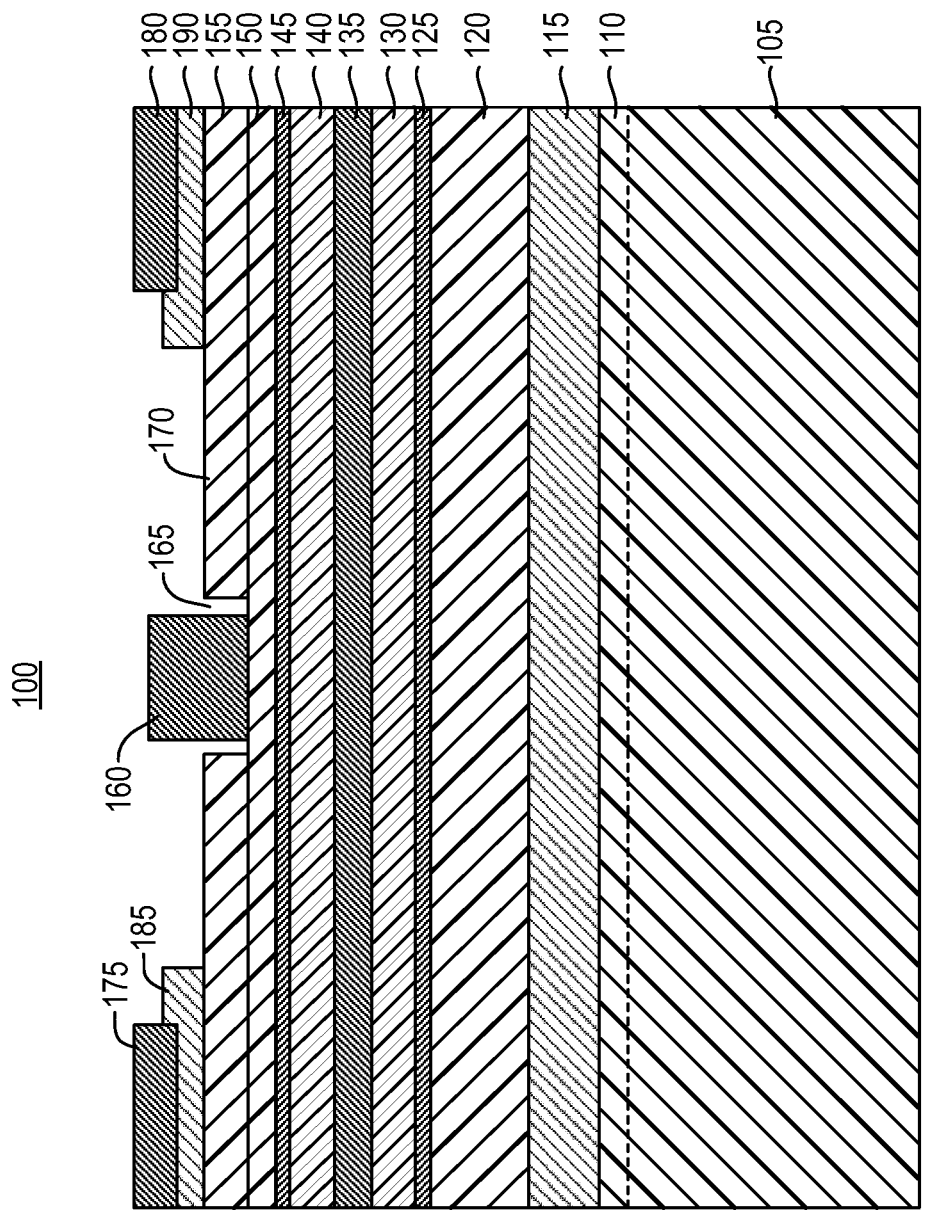
FIG. 1 is a cross-sectional view of a PHEMT device according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms 'a', 'an' and 'the' include both singular and plural referents, unless the context clearly dictates otherwise. Thus, for example, 'a device' includes one device and plural devices. The terms 'substantial' or 'substantially' mean to within acceptable limits or degree. The term 'approximately' means to within an acceptable limit or amount to one of ordinary skill in the art.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element.

The disclosed embodiments relate generally to PHEMT devices and related methods of manufacture. In certain embodiments, a PHEMT device comprises a buffer layer that is grown over a substrate at relatively low temperature and with an excess of N-type impurities and then annealed in a post-growth anneal process. The buffer layer effectively shields an active region of the PHEMT device from semiconductor traps that are typically present in the substrate and lower growth interfaces. The resulting device may have improved performance as measured in terms of device linearity metric such as kinks and consequent transconductance non-idealities, or memory effects due to drain lag, and gate lag. It may also provide decreased temperature sensitivity. These performance improvements may also enable new and more advanced applications for the device in radio-frequency (RF) power amplification, bias circuit and other circuit design, and switching.

The PHEMT devices in various embodiments are described as comprising certain materials, stoichiometries and methods of fabrication. These materials, stoichiometries and methods of fabrication are merely illustrative, and it is emphasized that other materials, stoichiometries and methods of fabrication that are within the purview of one of ordinary skill in the art having the benefit of the present disclosure are contemplated.

FIG. 1 is a cross-sectional view of a PHEMT device 100 according to a representative embodiment.

Referring to FIG. 1, PHEMT device 100 comprises a substrate 105, which is typically formed of a compound semiconductor such as a Group III-V semiconductor. In some embodiments, for instance, substrate 105 is formed of semi-insulating GaAs. The Group III-V semiconductor material can be a binary semiconductor, a ternary semiconductor, a quaternary semiconductor, or a quinary semiconductor, for example. In the description that follows, it will be assumed that substrate 105 and certain other features are formed using Group III-V semiconductor materials, but the use of Group IV or Group II-VI semiconductor materials is also contemplated for substrate 105 and other materials of PHEMT device 100.

Substrate 105 has an epitaxial growth interface 110, and subsequent layers are grown above this interface. Epitaxial growth interface 110 may also be the site of semiconductor traps that may capture injected electrons during device operation. Examples of such traps include EL2 deep donors and deep acceptor recombination centers.

A buffer layer 115 is disposed over substrate 105. Buffer layer 115 is grown over substrate 105 at relatively low temperature while being heavily doped with N-type dopants such as silicon (Si). Thereafter, buffer layer 115 is subjected to a post-growth annealing process.

As a more detailed example, buffer layer 115 typically comprises a layer of GaAs grown at a temperature of about 200 to 300° C. and heavily doped with Si with atomic concentration $5 \times 10^8$ to $1 \times 10^{19}$ per cubic cm. Buffer layer 115 is then annealed at a temperature less than 500° C., e.g., 470° C. for a duration of about 10 minutes. Buffer layer 115 is typically formed with a thickness of about 2500 Å to 5000 Å. It may be formed at a distance of as little as about 1000 Å below a subsequently formed InGaAs channel, or as much as 10000 Å below the subsequently formed InGaAs channel.

An example of a PHEMT comprising a buffer layer formed at low temperature without the use of the N-type dopants is disclosed in commonly owned U.S. patent Ser. No. 13/459,864 filed Apr. 30, 2012, the subject matter of which is incorporated by reference. As described in that application, a low temperature (LT) GaAs layer is grown with an excess of group V atoms (typically arsenic (As)), which produces high levels of interstitial As and As antisite defects and an intrinsic strain of 200-1400 ppm. Upon proper post-anneal, the material produces As microprecipitates and a high level of point defects, forming a material with high resistivity and very low carrier lifetimes. For example, a carrier lifetime of the LT buffer may be in a range of approximately 1 femtosecond to approximately 1 picosecond. The resulting material effectively shields channel conductivity from semiconductor traps in the substrate and/or growth interfaces, which would otherwise act in a transient way to influence device operation. This shielding of the trap states from the active device renders the PHEMT largely immune to a number of nonidealities which otherwise degrade the transistor performance in RF power and switching applications.

In buffer layer 115, a small fraction of the silicon dopant activates within the low temperature GaAs, compensating some deep acceptor trap states of the GaAs. The resistivity of the doped buffer layer remains relatively high despite the N-type doping. However, the doping has the effect of lowering the number of active acceptor trap states through compensation, and thus improving the recovery time of hysteresis. In other words, it reduces the number of states available for injected carriers or hot carriers to be trapped. By this doping approach, the hysteresis recovery is significantly reduced, e.g., to about 10 µs at room temperature. The large density of microprecipitate defects in the LT GaAs layer also prevents the injected carriers from reaching the relatively slow traps in substrate 105. Fewer active acceptor trapping states in buffer layer 115 results in faster recovery. Moreover, the doping with N-type dopants can also improve the temperature sensitivity of recovery of hysteresis.

In some embodiments, an intermediate GaAs spacer or combination of a thin GaAs superlattice layer and an undoped GaAs of between 1000 Å and 10000 Å is grown near 590 to 610° C. on top of the low temperature GaAs. During growth of this intermediate GaAs layer, the silicon activation in the LT GaAs layer improves. Moreover the depth of the Si donor energy from the conduction band also reduces. The shallower silicon energy depth reduces the temperature sensitivity of the hysteresis. In an example using a thin GaAs/AlGaAs superlattice, the superlattice may comprise GaAs layers having a thickness on the order of 15 Å to approximately 50 Å, and alternating with AlGaAs having a thickness of approximately 50 Å to approximately 200 Å. The total thickness of epitaxial buffer layer 120 is between approximately 500 Å to approximately 10000 Å.

In other embodiments, a combination of GaAs spacer, and a high mole fraction indirect bandgap $Al_xGa_{1-x}As$, with composition x between 50% and 80% grown near 590 to 610 C is used as the intermediate layer, with the GaAs spacer directly on top of the LT GaAs buffer. The GaAs spacer thickness may range from 200 Å to 500 Å, and the high mole fraction AlGaAs thickness from 400 Å to 800 Å. Such a combination can improve the leakage characteristics of the device.

A first charge supply layer 125 is disposed over epitaxial buffer layer 120 and illustratively comprises AlGaAs. First charge supply layer 125 may be a thin bulk-doped layer, such as GaAs or AlGaAs doped with Si to a doping concentration of approximately of $1 \times 10^{18}$ $cm^3$), or may be a delta-doped layer (typically Si-doped), which works in conjunction with a second charge supply layer 145 to produce a total electron sheet concentration in a pseudomorphic channel layer ("channel layer") 135 between approximately $1\times10^{12}$ cm$^{-2}$ and $3\times10^{12}$ cm$^{-2}$. First charge supply layer 125 typically has a thickness of between 0 Å and approximately 100 Å.

A first spacer layer 130 is disposed over the first charge supply layer 125. First spacer layer 130 separates ionized donor states from channel layer 135, effectively eliminating mobility degradation due to impurity scattering. Channel layer 135 is disposed over first spacer layer 130 and illustratively comprises InGaAs. Typically, channel layer 135 comprises undoped In$_x$Ga$_{1-x}$As, where x ranges from 15% to 35%, and has a thickness in a range of approximately 50-150 Å.

The total thickness of epitaxial buffer layer 120, first charge supply layer 125 and first spacer layer 130 (i.e., the layers between buffer layer 115 and channel layer 135) may be in the range of approximately 500 Å to approximately 10000 Å, for example. The use of a relatively "thin" stack of layers between buffer layer 115 and channel layer 135 can reduce leakage current. A second spacer layer 140 is disposed over channel layer 135, and one or more second charge supply layers 145 are provided over second spacer layer 140. Second spacer layer 140 may comprise, for instance, undoped GaAs or AlGaAs, with a thickness between approximately 25 and 100 Å.

A Schottky contact layer 150 is disposed over second charge supply layer 145. Schottky contact layer 150 typically comprises undoped AlGaAs, and typically has a thickness of between approximately 50 and 400 Å.

A layer 155 is formed over Schottky contact layer 150 to facilitate construction of a high breakdown recess 165. Layer 155 is typically undoped GaAs or AlGaAs, but may also comprise a thinner heavily doped layer as a portion of its construction. The total thickness of layer 155 typically ranges from approximately 100 Å to 700 Å. Recess 165 is typically formed in layer 155 by etching, or alternatively, by sintering the gate metal.

A Schottky gate 160 is formed in recess 165 and in contact with Schottky contact layer 150. A source contact 175 is provided over a heavily doped first ohmic contact layer 185, and a drain contact 180 is provided over a suitable second ohmic contact layer 190. The heavily doped first ohmic contact layer 185 is typically GaAs, is usually doped in a range of about $1\times10^{18}$ cm$^{-3}$ to $2\times10^{19}$ cm$^{-3}$ and has thickness of approximately 200 and 2000 Å. Source contact 175 and drain contact 180 may comprise any ohmic suitable contact metal stack, but are generally formed of an alloy of AuGeNi with thickness from several hundred to several thousand Angstroms.

Figure 2A:
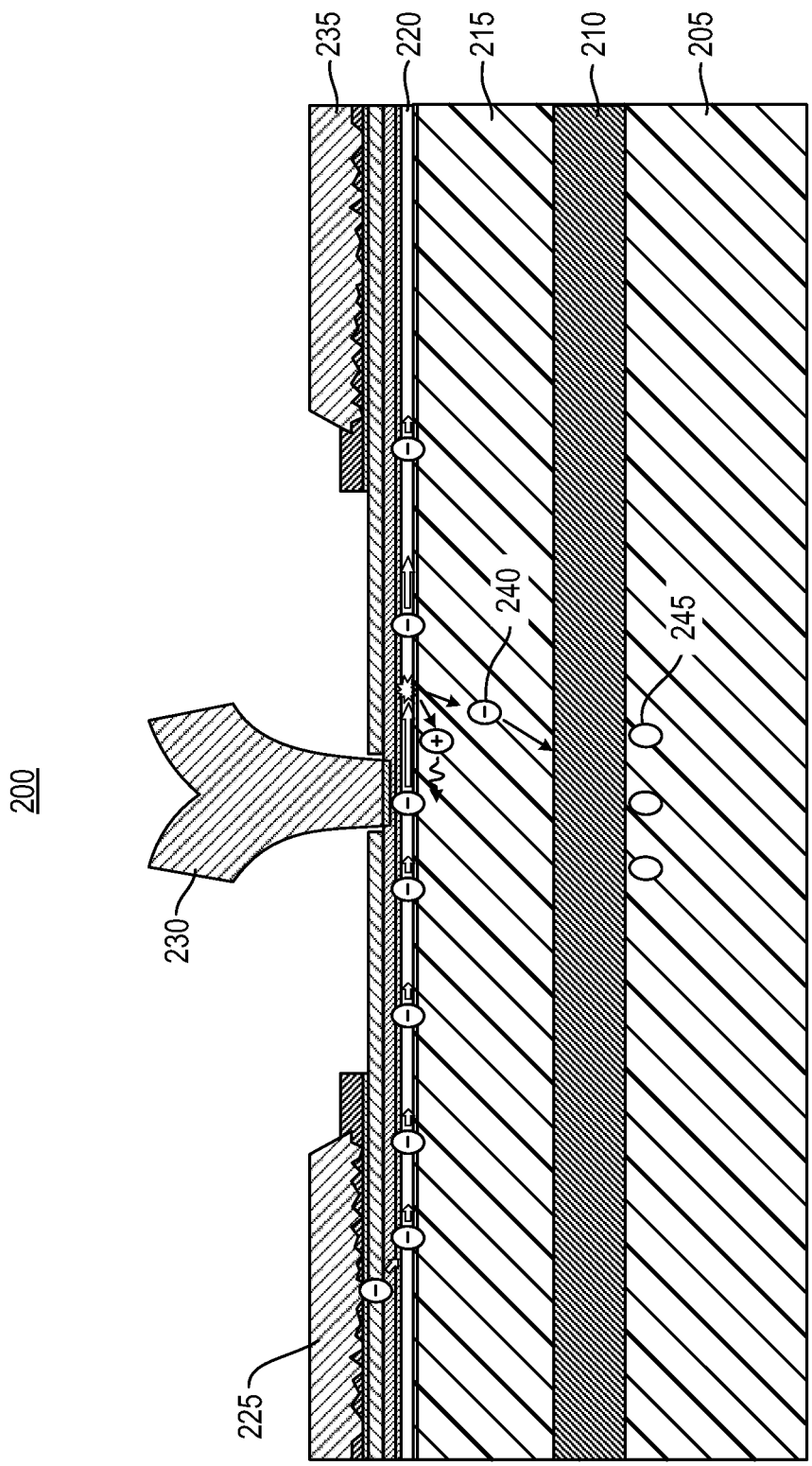
FIG. 2A is a cross-sectional view of a PHEMT device operating at relatively high drain bias $V_{ds}$ according to a representative embodiment.
Figure 2B:
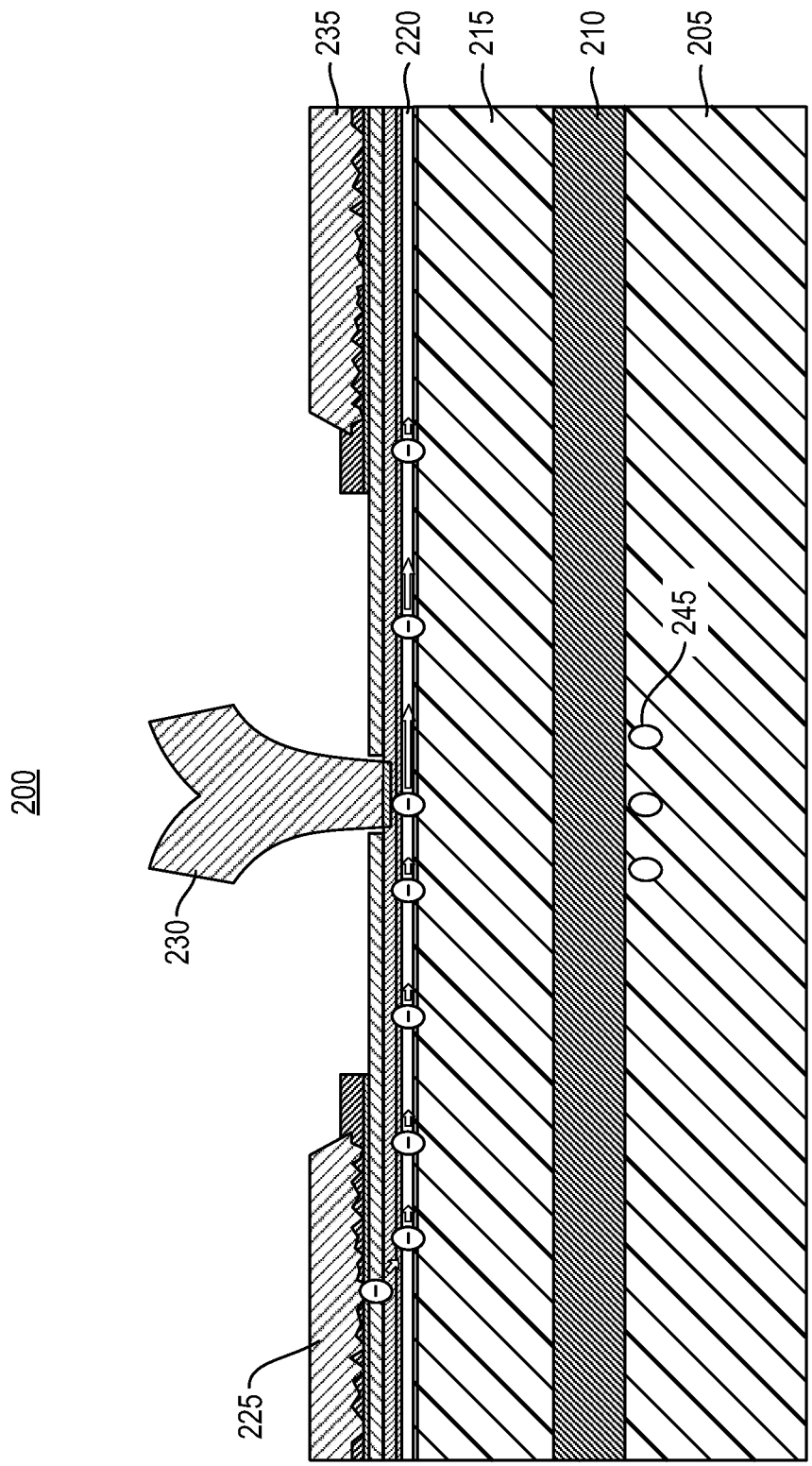
FIG. 2B is a cross-sectional view of a PHEMT device operating at relatively low drain bias $V_{ds}$ according to a representative embodiment.

FIG. 2A is a cross-sectional view of a PHEMT device 200 operating at relatively high drain bias ($V_{ds}$) according to a representative embodiment, and FIG. 2B is a cross-sectional view of a PHEMT device 200 operating at relatively low drain bias ($V_{ds}$) according to a representative embodiment. Certain details of PHEMT device 200 are common to PHEMT device 100 described above, and are not repeated in order to avoid redundancy.

Referring to FIGS. 2A and 2B, PHEMT device 200 comprises a substrate 205, a buffer layer 210, intermediate layers 215, a pseudomorphic channel ("channel") 220, a gate 230, a source 225 and a drain 235.

Substrate 205, buffer layer 210, and channel 220 can be formed similar to substrate 105, buffer layer 115, and channel layer 135 of FIG. 1, respectively. Intermediate layers 215 are formed between buffer layer 210 and channel 220 and may comprise, for instance, epitaxial buffer layer 120, first charge supply layer 125, and first spacer layer 130. Gate 230, source 225, and drain 235 are disposed over channel 220, and they may comprise, for instance, second spacer layer 140, second charge supply layer 145, Schottky contact layer 150, first ohmic contact layer 185, and second ohmic contact layer 190.

Under high drain bias, as shown in FIG. 2A, PHEMT device 200 produces mobile charge 240 that migrates from the device's active region toward substrate 205. This mobile charge 240 may be generated by impact ionization events, may comprise hot electrons, or may simply be incompletely confined carriers from the active region of the PHEMT that drift or diffuse to substrate 205.

In PHEMT devices that do not include buffer layer 210, mobile charge 240 and the electric field influence the equilibrium of deep level traps 245 in substrate 205, resulting in net negative charge in deep level traps 245 which result in backgating of the PHEMT. Thereafter, under low drain bias, traps slowly re-equilibrate and become neutrally charged.

Buffer layer 210, however, effectively shields deep level traps 245 from mobile charge 240 and prevents deep penetration of the electric field that comes from PHEMT device 200 operating under high drain bias. Accordingly, the charge on deep level traps 245 tends to remain static regardless of the bias conditions of the PHEMT.

The effective shielding of deep level traps 245 is accomplished by various properties of buffer layer 210 that arise, at least in part, from low-temperature growth and annealing and N-type doping as described above in relation to FIG. 1. In particular, the low-temperature growth and annealing tends to increase the concentration of relatively fast traps, and the doping tends to lower the number of active acceptor trap states through compensation. Both of these changes tend to improve the recovery time of hysteresis. For instance, due to the relatively high concentration of fast traps in buffer layer 210, the re-equilibration of carriers being recombined with traps and carriers in traps that are discharged back to channel 220 in buffer layer 210 is relatively fast. As such, buffer layer 210 effectively prevents mobile charge 208 from being transported through buffer layer 210. By virtue of the relatively high density of relatively "fast" traps in buffer layer 210 and the depletion regions formed by the microprecipitates (e.g., As) in buffer layer 210, the deleterious influence of the deep level traps 245 in substrate 205 is substantially mitigated if not eliminated.

Referring to FIG. 2B the influence of the deep level traps 245 is lower during low bias conditions. Nevertheless, buffer layer 210 continues to shield carriers in channel 220, and reduces the rate of recombination of carriers with the deep level traps.

At each bias operation low and high, an equilibrium is reached between the mobile carriers and the capture and discharge of mobile carriers from fixed traps. Because of the relatively long lifetime of deep level traps 245, reaching this equilibrium in a conventional PHEMT takes a relatively long time. Moreover, each time the device bias is changed, a new equilibrium is reached between carriers being recombined with traps and carriers in traps that are discharged back to the channel. So, each time a known PHEMT switches between high bias operation and low bias operation, these equilibriums need to be reached. This "re-equilibration" is dependent on various factors, including the number trapped carriers and the lifetime of the deep level traps found in substrate 205. The population of acceptor traps and donor traps that are ionized changes depending upon whether the device is operating in a high bias (high electrostatic field) or a low bias (low electrostatic field). This change in the population of the traps is dependent on the non-radiative lifetime of the deep level traps. Because of the relatively long non-radiative lifetime of deep-level traps in the substrate in conventional PHEMTs, this change in population takes a relatively long time, and ultimately impacts the drain lag of the known PHEMT, resulting in undesirable settling times for the device.

By contrast, through the combination of a relatively high concentration of "fast" traps, the reduction in active trap states through doping, and the electric field effect provided by the microprecipitates of buffer layer 210 of PHEMT device 200, the re-equilibration of carriers being recombined with traps and carriers in traps that are discharged back to channel 220 in buffer layer 210 is relatively fast, and the change to trap ionization in "slow" deep-level traps in substrate 205 is significantly reduced, if not eliminated. As described more fully below, PHEMT device 200 realizes a significant improvement in the response characteristics.

Figure 3:
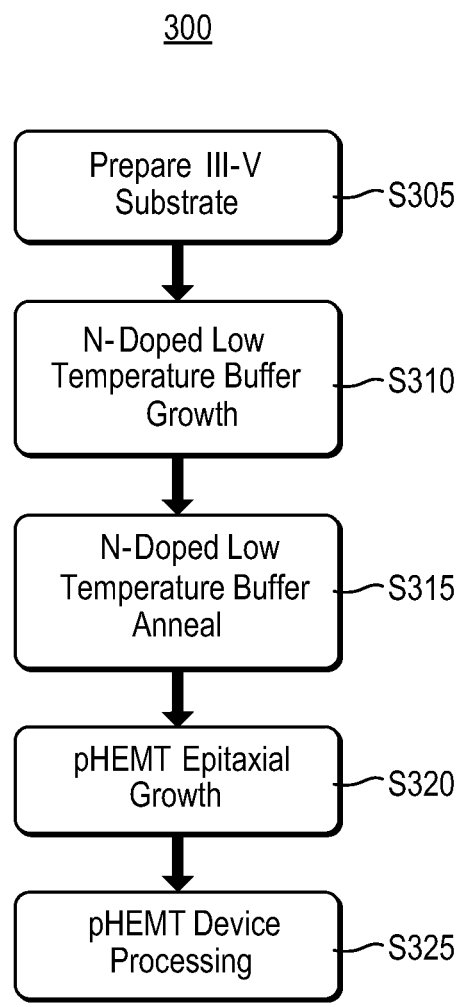
FIG. 3 is a flowchart illustrating a method of fabricating a PHEMT device according to a representative embodiment.

FIG. 3 is a flowchart illustrating a method 300 of fabricating a PHEMT device according to a representative embodiment. This method can be used to fabricate PHEMT device 100 or 200 described above, for instance. In the description that follows, example method features will be indicated by parentheses to distinguish them from example apparatus features.

Referring to FIG. 3, the method begins by preparing a Group III-V semiconductor substrate (S305). Typically, the substrate undergoes a cleaning sequence using known methods and materials. Such cleaning methods may include a known combination of solvent and/or etching cleans. In addition, the cleaning methods typically include an in-situ deoxidation at a relatively high temperature in the epitaxial reactor, usually under Group V (e.g., As) flux.

Next, a doped LT annealed buffer layer is grown over the substrate using an epitaxial growth method such as molecular beam epitaxy (MBE) (S310). The buffer layer is typically grown at a temperature in the range of less than approximately 250° C. to approximately 325° C. and with an excess flux of Group V (e.g., As) atoms to promote formation of a relatively high concentration of interstitial and substitutional (antisite) defects in the buffer layer. For example, the interstitial and substitutional defects combined may have a concentration in the range of approximately $1 \times 10^{18}$ cm$^{-3}$ to approximately $1 \times 10^{20}$ cm$^{-3}$. In addition, the buffer layer is heavily doped with N-type ions, such as Si having atomic concentration $5 \times 10^{18}$ to $1 \times 10^{19}$ per cubic cm.

The Group V-to Group III flux ratio generally depends on growth temperature, reactor geometry and growth rate. The growth sequence of 303 of method 300, the Group V (e.g., As) to Group III material flux ratio is typically selected so that the resulting excess Group V material in the buffer layer results in a strain of approximately 400 ppm in the grown buffer layer. More generally, the Group V material to Group III flux ratio is selected such that the resulting excess Group V material in the buffer layer results in a strain in the buffer layer in the range of approximately 300 ppm to approximately 500 ppm. The measurement of the strain (for example, by double crystal x-ray diffraction) and proper selection of the Group V to Group III material flux ratio to obtain the target strain are beneficial to achieving the proper amount of excess Group V material (e.g., As), which is required to achieve desired characteristics of the buffer layer of the present teachings.

Next, post growth annealing is performed (S315). The annealing involves heating the doped LT buffer layer, which serves to promote a closer match of the lattice constant of the buffer layer with the underlying substrate, and with subsequently grown layers. During the annealing, nearly all of the excess strain is relieved from the buffer layer (i.e., the strain in the buffer layer is insignificant), and much of the excess Group V material (e.g., As) segregates to form microprecipitates in the buffer layer as described above.

The increased temperature of the anneal step promotes a precipitate growth, where relatively higher temperatures and longer anneal times result in increased microprecipitate size. However, annealing higher temperatures and for longer anneal times, can result in a lower concentrations of point defect Group V (e.g., As) complexes in the buffer layer. Accordingly, the anneal step is typically carried out at a temperature less than approximately 575° C. but greater than approximately 400° C. This anneal occurs in the epitaxial growth chamber, under a sufficient minimum background flux of Group V material (e.g., As) as needed to maintain an epitaxial surface. Notably, it may be beneficial to carry out the initial anneal step at as low of a temperature as possible (e.g., between approximately 400 and 500° C.) to promote the highest concentration and shortest lifetime of fast traps in the buffer layer, while still relieving the excess strain from the buffer layer. As such, it may be beneficial to effect the annealing and growth of subsequent layers at temperatures that are less than the noted upper limit (approximately 590° C.) in order to avoid adversely impacting the buffer layer.

Thereafter, remaining epitaxial layers of the PHEMT are grown (S320). These layers can be grown over the buffer layer using known methods and materials. For example, referring to FIG. 1, S320 may include growth of epitaxial buffer layer 120, first charge supply layer 125, first spacer layer 130, channel layer 135, second spacer layer 140, second charge supply layer 145, Schottky contact layer 150, and (in the same processing sequence) first and second ohmic contact layers 185 and 190. These layers are doped as necessary at this stage of method 300. As noted above, the total thickness of epitaxial buffer layer 120, the first charge supply layer 125 and first spacer layer 130 (i.e., the layers between buffer layer 115 and channel layer 135) is typically in the range of approximately 500 Å to approximately 3500 Å to 10000 Å. Moreover, during the formation of the layers between buffer layer 115 and channel layer 135, in some implementations it may be useful to remove or not include aluminum in the layers.

Finally, further processing is effected to complete the method 300 (S325). For example, the source, drain and gate may be formed using known methods and materials.

Figure 4A:
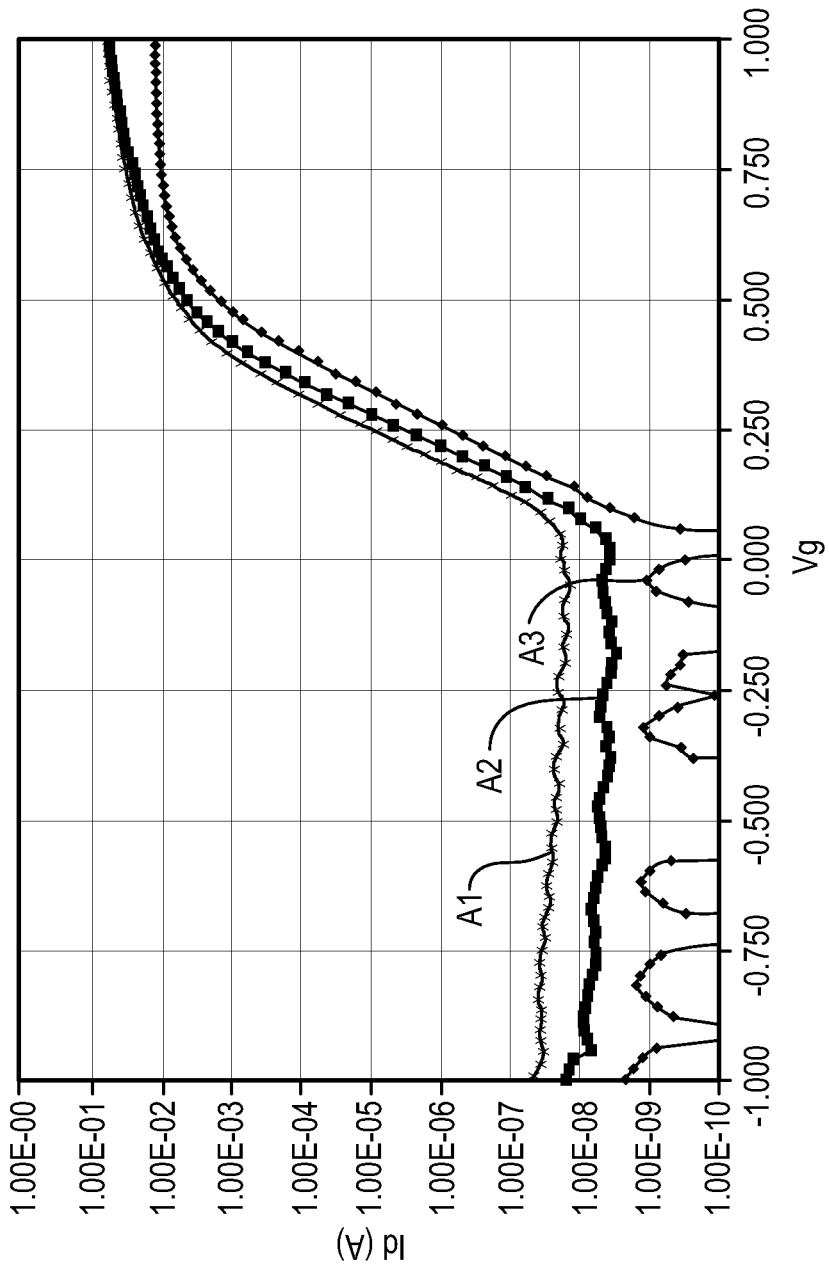
FIG. 4A is a graph showing the drain current $I_d$ versus gate voltage $V_g$ for selected drain voltages of a conventional PHEMT device.
Figure 4B:
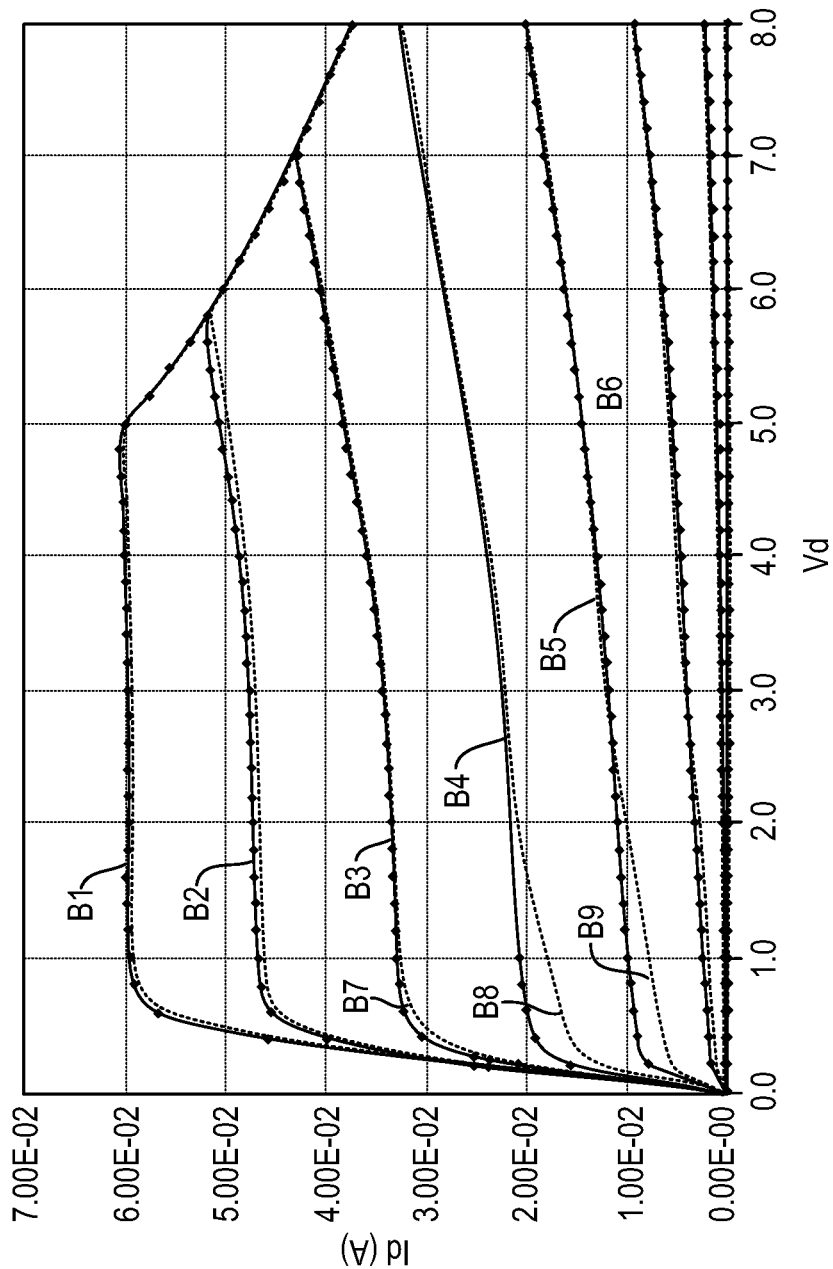
FIG. 4B is a graph showing the pulsed drain current $I_d$ versus drain voltage $V_d$ for selected gate voltages at two different quiescent drain voltages for a conventional PHEMT device.
Figure 4C:
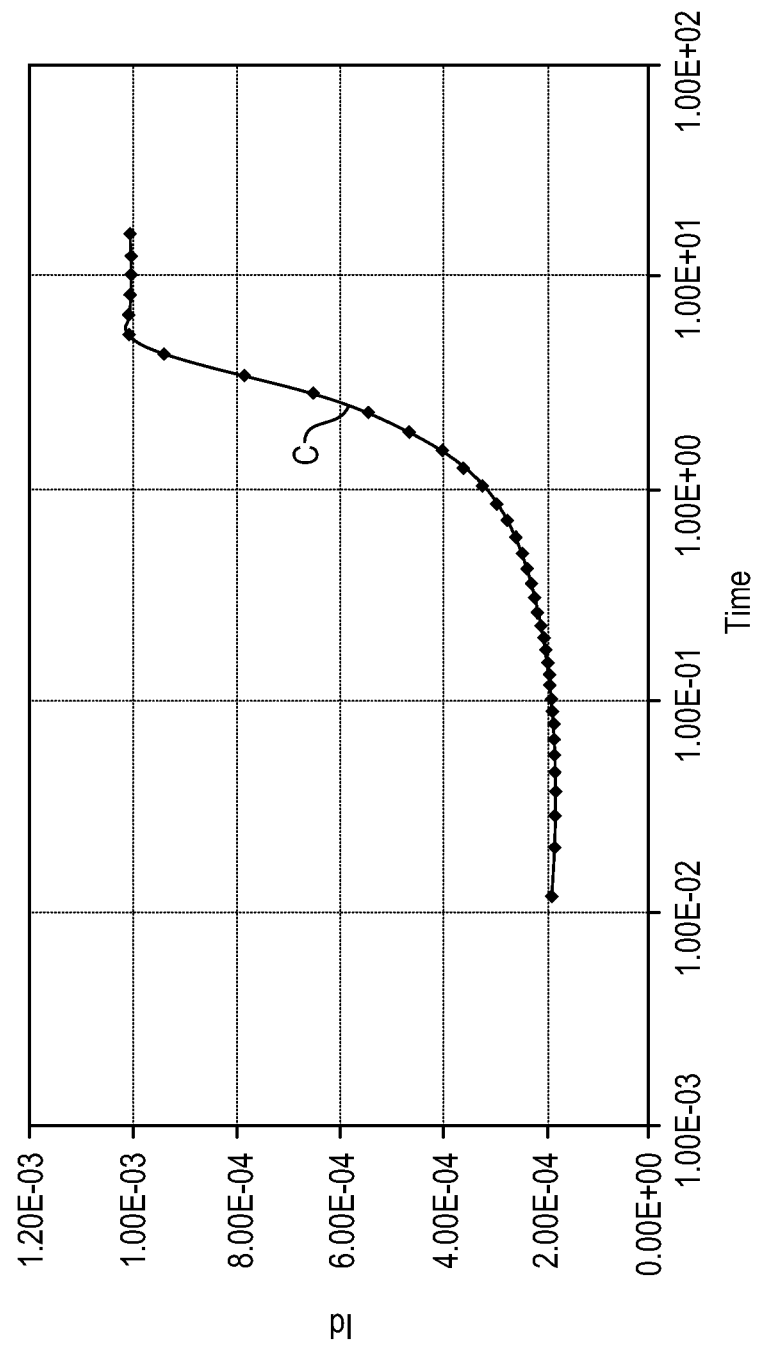
FIG. 4C is a graph showing the drain current $I_d$ as a function of time following application of a gate voltage pulse at low drain bias, in a conventional PHEMT device.
Figure 5A:
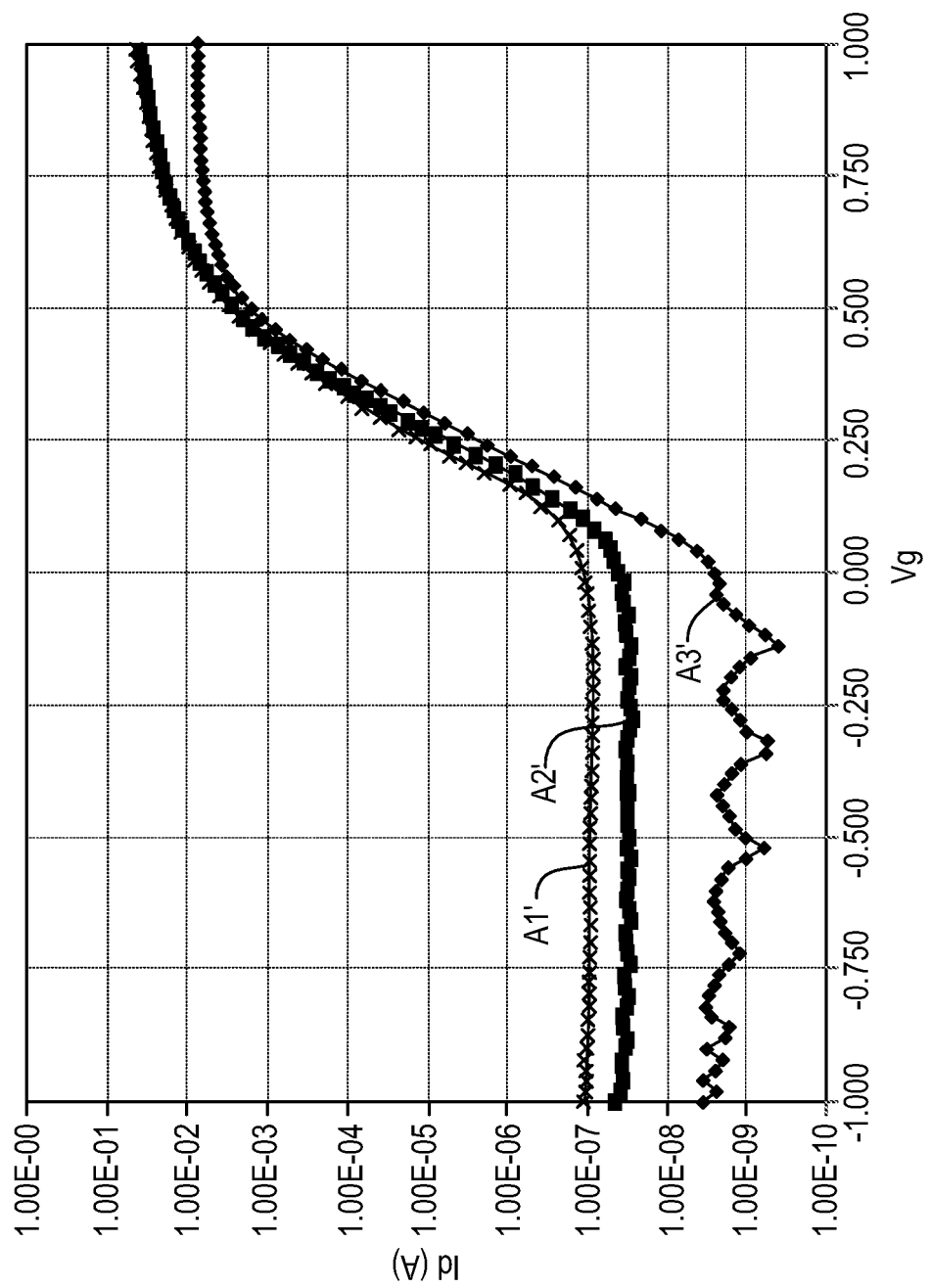
FIG. 5A is a graph showing the drain current $I_d$ versus gate voltage $V_g$ for selected drain voltages in a PHEMT device according to a representative embodiment.
Figure 5B:
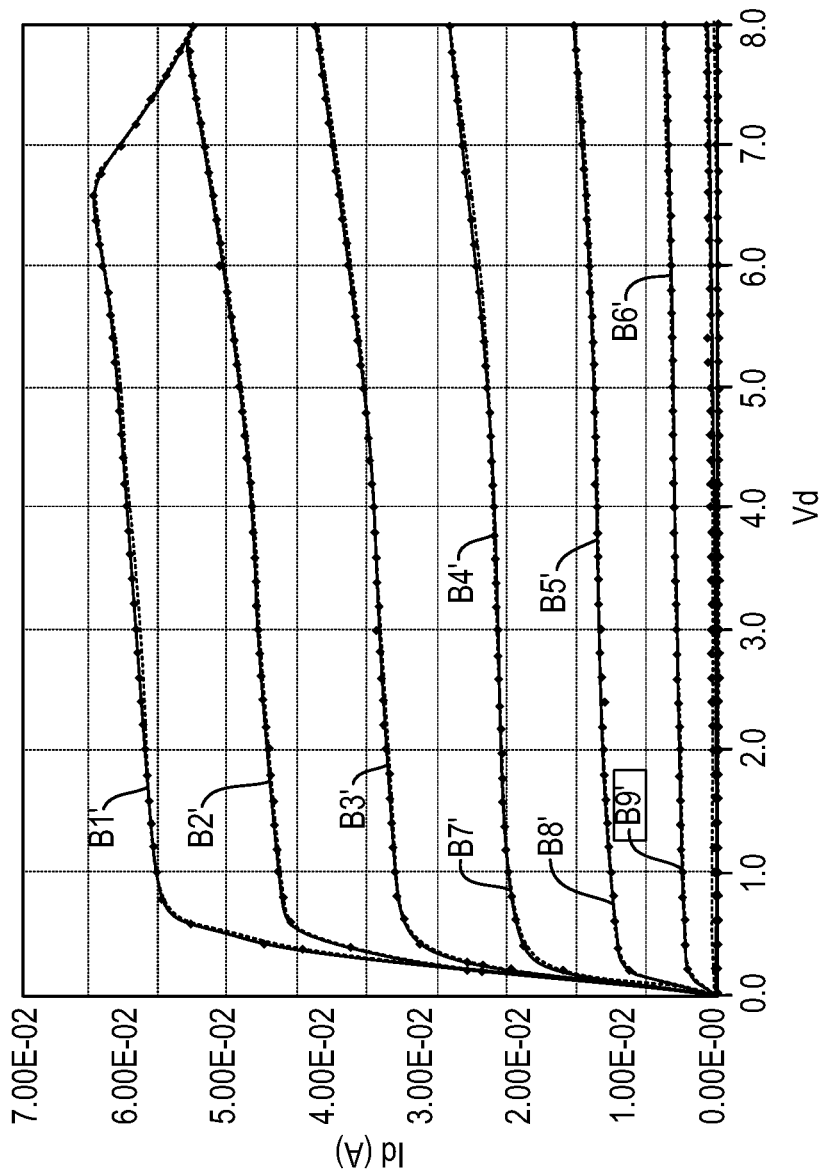
FIG. 5B is a graph showing the pulsed drain current $I_d$ versus drain voltage $V_d$ for selected gate voltages at two different quiescent drain voltages in a PHEMT device according to a representative embodiment.
Figure 5C:
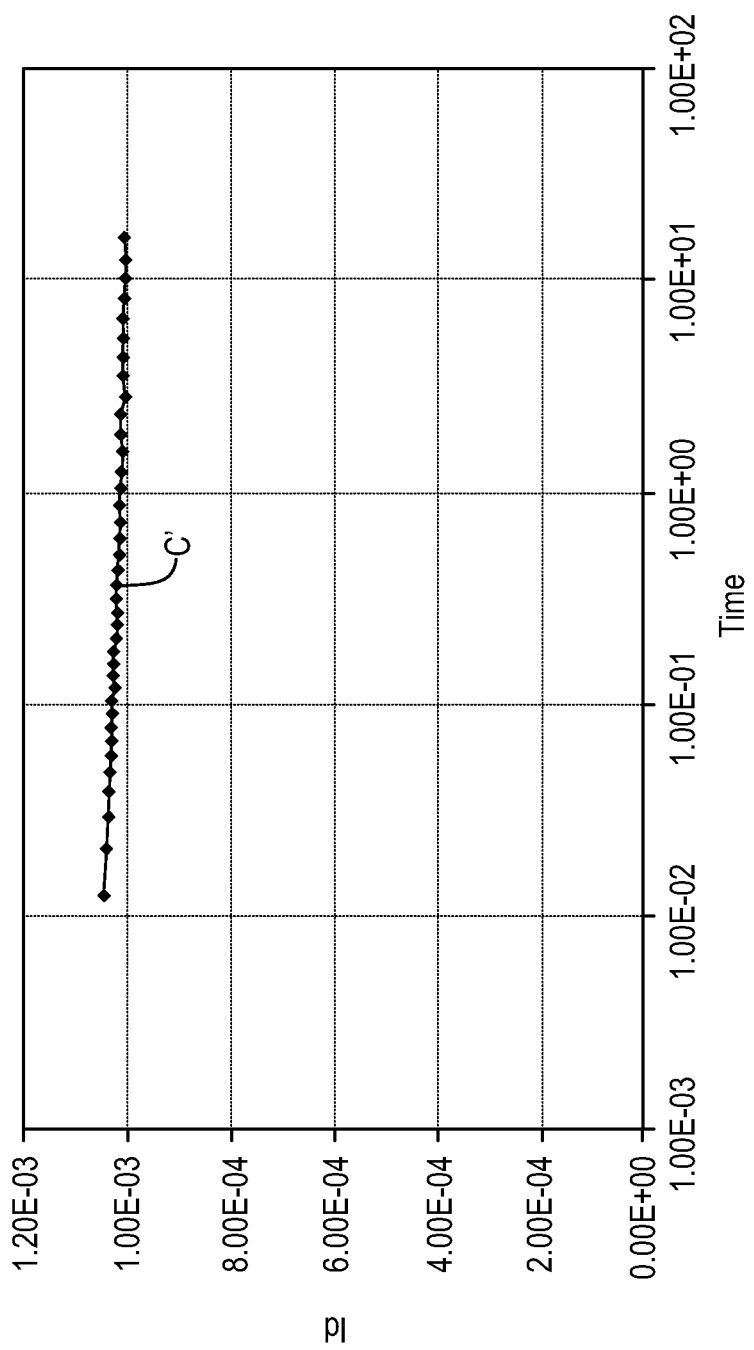
FIG. 5C is a graph showing the drain current $I_d$ as a function of time following application of a gate voltage pulse at low drain bias, in a PHEMT device according to a representative embodiment.

FIGS. 4A-4C are graphs illustrating performance characteristics of a conventional PHEMT device and FIGS. 5A-5C are graphs illustrating corresponding performance characteristics of a PHEMT device according to a representative embodiment. These graphs are provided for comparison purposes to illustrate certain improvements provided by the representative embodiments.

FIGS. 4A and 5A are graphs showing the pulsed drain current $I_d$ versus gate voltage $V_g$ versus time for a selected series of drain voltages of a conventional PHEMT device and a PHEMT device according to a representative embodiment.

Referring to FIGS. 4A and 5A, curves A1-A3 and A1'-A3' represent the drain current vs gate voltage for respective drain voltages Vd=0.1V, 3V, and 6V for the conventional PHEMT device and the PHEMT device according to the representative embodiment.

FIGS. 4B and 5B are graphs showing the pulsed drain current $I_d$ versus drain voltage $V_d$ for a selected series of gate voltages and with drain quiescent voltage of 5 volts for curves 1-6 and 0 volts for curves 7-9 for the conventional PHEMT device and the PHEMT according to the representative embodiment.

Curves B7-B9 in FIG. 4B depict $I_d$ VS. $V_d$ illustratively at 1 msec after the bias is supplied in pulsed fashion. Plainly, the response of the conventional PHEMT device depicted in FIG.

4B has an undesirable drain current suppression when pulsed from a 5 volt quiescent voltage to a low to moderate applied drain voltage.

In contrast, curves B7'-B9' in FIG. 5B depict $I_d$ vs. $V_d$ in which the drain current is pulsed, again illustratively at 1 msec. As can be appreciated from a review of curves B7'-B9' at relatively low to moderate applied drain voltages, there is substantially no difference in the Id(Vd) curves when pulsed from drain quiescent voltages of 6 volts and 0 volts.

FIGS. 4C and 5C are graphs showing the drain current $I_d$ versus time after switching gate voltage for a conventional PHEMT device and a PHEMT device respectively, according to a representative embodiment.

Referring to FIGS. 4C and 5C, the drain current of the PHEMT device according to a representative embodiment rises significantly faster to the study state level, compared to the conventional PHEMT device after the gate voltage is switched from a quiescent voltage of −5 V to a small positive voltage of about 0.4 V.

Figure 6:
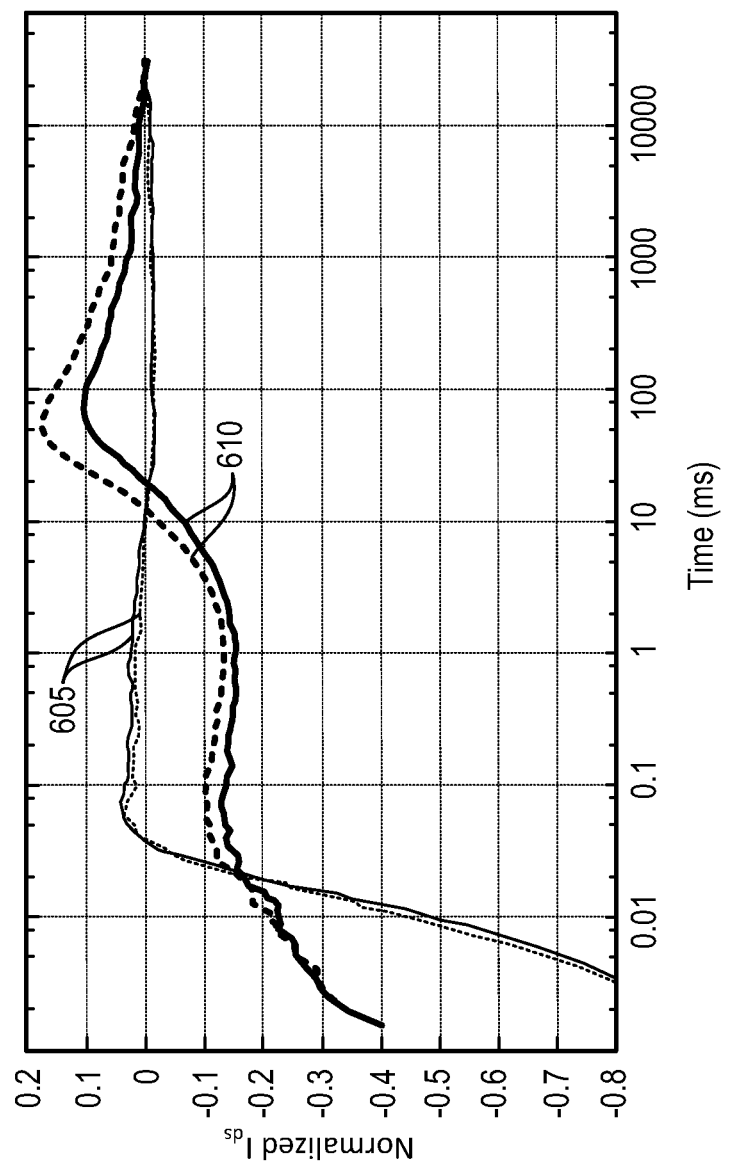
FIG. 6 is a graph comparing the drain lag of a conventional PHEMT device and a PHEMT device according to a representative embodiment.
Figure 7:
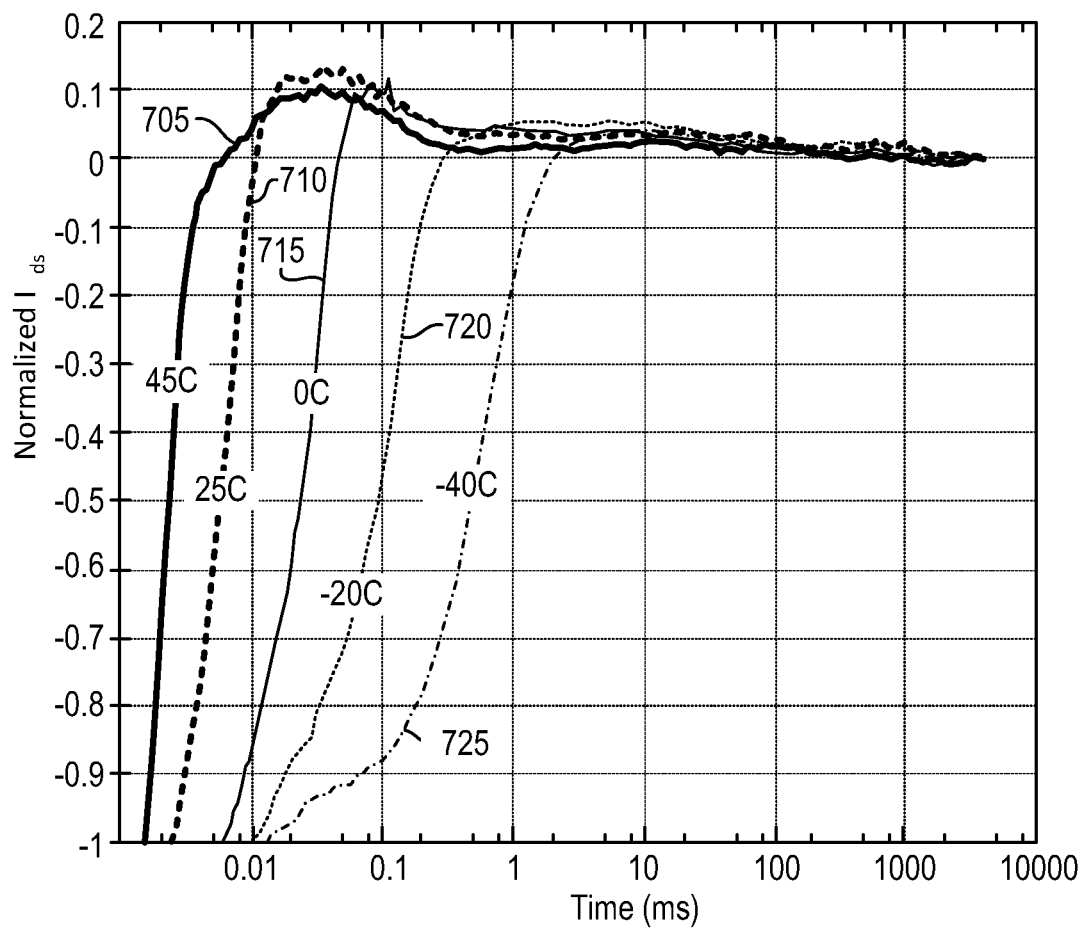
FIG. 7 is a graph illustrating the drain lag of a PHEMT device according to a representative embodiment under different temperature conditions.

FIG. 6 is a graph comparing the hysteresis of a conventional PHEMT device and a PHEMT device having a low-temperature annealed buffer layer, and FIG. 7 is a graph illustrating the hysteresis of a PHEMT device according to a representative embodiment under different temperature conditions. In each of these graphs, hysteresis is represented by drain lag, i.e., $I_{ds}$ versus time after a sudden reduction in $V_d$. The x-axis represents the log scale for time since the PHEMT device was transitioned from high bias 5V to low bias 1V, and the y-axis represents the relative deviation from the final drain current over time; i.e., $(I_{dinstantaneous}-I_{dfinal})/I_{dfinal}$. The graphs of FIGS. 6 and 7 were generated for 1×100 μm PHEMT devices biased at 10 mA/mm while the drain voltage was switched from a quiescent level of Vds=5 V to Vds=1 V. The graph of FIG. 7 was also generated with varying levels of device temperature.

Referring to FIG. 6, curves 605 depict the deviation versus time of the PHEMT device having the LT annealed buffer layer in two different measurements, and curves 610 depict the deviation versus time of the conventional PHEMT device in two different measurements. By way of example, a normalized $I_{ds}$ value of −0.1 indicates that the instantaneous drain current is about 10% lower than what it is when the PHEMT finally settles. As can be appreciated from a review of curves 610, the conventional PHEMT device does not settle to the final value until several seconds have elapsed, whereas the PHEMT device according to a representative embodiment settles around 0.1 ms.

Referring to FIG. 7, curves 705-725 depict the deviation versus time of the PHEMT device having the N-doped LT annealed buffer layer at respective temperatures of 45, 25, 0, −20, and −40° C. As illustrated by these curves, the PHEMT device settles before 10 ms at each of the illustrated temperatures, and it settles before 1 ms for most of the illustrated temperatures.

Figure 8:
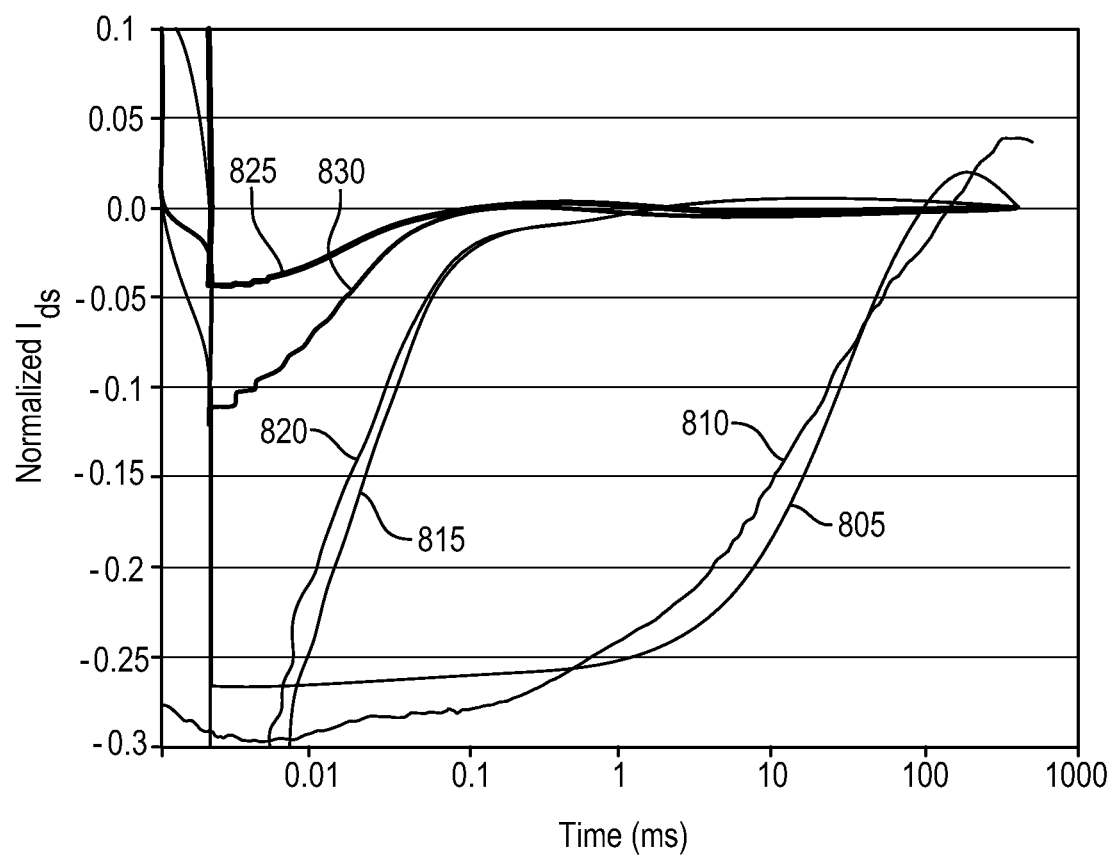
FIG. 8 is a graph comparing the drain lag of various PHEMT devices, as determined according to simulations and measurements.

FIG. 8 is a graph comparing the hysteresis of various PHEMT devices as determined according to simulations and measurements. In this graph, hysteresis is represented by drain lag, i.e., $I_{ds}$ versus time after a sudden reduction in $V_d$.

Referring to FIG. 8, curves 805 and 810 represent the simulated and measured hysteresis of a conventional PHEMT device without an LT buffer layer. Curves 815 and 820 represent the simulated and measured hysteresis of a second PHEMT device having an LT annealed buffer layer but no N-type doping. Curves 825 and 830 represent the simulated and measured hysteresis of a third PHEMT device having an LT annealed buffer layer with N-type doping.

As illustrated by these curves, the use of an LT annealed buffer layer produces a significant reduction in hysteresis, and the further use of N-type doping in the LT annealed buffer produces still further improvement. Accordingly, the first PHEMT device does not settle until much later than 100 ms, while the second PHEMT device settles at about 10 ms, and the third PHEMT device settles at about 0.1 ms.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A pseudomorphic high electron mobility transistor (PHEMT), comprising:
    a substrate comprising a Group III-V semiconductor material;
    a buffer layer disposed over the substrate, wherein the buffer layer comprises microprecipitates of a Group V semiconductor element and is doped with an N-type dopant; and
    a channel layer disposed over the buffer layer.

2. The PHEMT of claim 1, wherein the N-type dopant comprises silicon.

3. The PHEMT of claim 1, wherein the N-type dopant has an atomic concentration in the buffer layer in a range of approximately $5×10^{18}$ to $1×10^{19}$ cm$^{-3}$.

4. The PHEMT of claim 1, wherein the buffer layer effectively shields carriers in the channel from deep level traps in the substrate.

5. The PHEMT of claim 1, wherein the N-type dopant reduces a number of active trap states in the buffer layer.

6. The PHEMT of claim 1, wherein the buffer layer further comprises relatively fast traps due to excess Group V atoms in the buffer layer.

7. The PHEMT of claim 6, wherein a carrier lifetime of the LT buffer is in a range of approximately 1 femtosecond to approximately 1 picosecond.

8. The PHEMT of claim 1, wherein the buffer layer is formed by a process comprising:
    growing the buffer layer over the substrate at a growth temperature of in the range of less than approximately 325° C. and greater than approximately 200° C.; and
    before providing a plurality of layers over the buffer layer, annealing the buffer layer.

9. The PHEMT of claim 1, wherein the buffer layer has an intrinsic strain in the range of approximately 300 ppm to approximately 500 ppm before the annealing.

10. The PHEMT of claim 1, wherein the buffer layer comprises interstitial defects comprising the Group V semiconductor element.

11. The PHEMT of claim 10, wherein the buffer layer comprises substitutional defects comprising the Group V semiconductor element.

12. The PHEMT of claim 11, wherein the interstitial defects and the substitutional defects combined have a concentration in the range of approximately $1×10^{18}$ cm$^{-3}$ to approximately $1×10^{20}$ cm$^{-3}$.

13. The PHEMT of claim 1, further comprising a plurality of layers disposed over the substrate and between the buffer layer and the channel layer, wherein a total thickness of the plurality of layers is in the range of approximately 500 Å to approximately 10000 Å.

14. The PHEMT of claim 1, wherein the Group III-V semiconductor material comprises gallium and arsenic.

15. The PHEMT of claim 10, wherein the Group V semiconductor element comprises As.

16. A power amplifier comprising the PHEMT of claim 1.

17. A method of fabricating a pseudomorphic high electron mobility transistor (PHEMT), comprising:
  growing a buffer layer over a substrate at a growth temperature of in the range of less than approximately 325° C. and greater than approximately 200° C.;
  doping the buffer layer with an N-type dopant; and
  before providing a plurality of layers over the buffer layer, annealing the buffer layer.

18. The method of claim 17, wherein the annealing is effected at a temperature less than approximately 575° C.

19. The PHEMT of claim 1, wherein the N-type dopant comprises silicon.

20. The PHEMT of claim 1, wherein the N-type dopant has an atomic concentration in the buffer layer in a range of approximately $5\times10^{18}$ to $1\times10^{19}$ cm$^{-3}$.

* * * * *